United States Patent
Roettinger

(10) Patent No.: US 10,809,306 B2
(45) Date of Patent: Oct. 20, 2020

(54) METHOD FOR CHECKING A BATTERY STATE AND AN APPARATUS FOR CHECKING A BATTERY STATE USING VOLTAGE DIFFERENCES

(71) Applicant: AUDI AG, Ingolstadt (DE)

(72) Inventor: Christian Roettinger, Ingotstadt (DE)

(73) Assignee: AUDI AG, Ingolstadt (DE)

(*) Notice: Subject to any disclaimer, the term of this patent is extended or adjusted under 35 U.S.C. 154(b) by 208 days.

(21) Appl. No.: 15/985,759

(22) Filed: May 22, 2018

(65) Prior Publication Data

US 2018/0340980 A1    Nov. 29, 2018

(30) Foreign Application Priority Data

May 23, 2017   (DE) .................. 10 2017 208 770

(51) Int. Cl.
*G01R 31/36*        (2020.01)
*G01R 31/3842*    (2019.01)
(Continued)

(52) U.S. Cl.
CPC ....... *G01R 31/3842* (2019.01); *G01R 31/367* (2019.01); *G01R 31/3648* (2013.01);
(Continued)

(58) Field of Classification Search
CPC ............. G01R 31/3842; G01R 31/367; G01R 31/3835; G01R 31/392; G01R 31/396; G01R 31/3648; H01M 10/486
(Continued)

(56) References Cited

U.S. PATENT DOCUMENTS 4,590,430 A * 5/1986 Vandenberghe .... H01M 10/482
                                                                  324/427
5,027,294 A * 6/1991 Fakruddin .......... G01R 31/3648
                                                                  713/300
(Continued)

FOREIGN PATENT DOCUMENTS

CN        101034137 A     9/2007
CN        101351717 A     1/2009
(Continued)

OTHER PUBLICATIONS

Office Action dated Apr. 1, 2020 in corresponding Chinese Application No. 201810492941.X, 16 pages including English-language translation.

*Primary Examiner* — John T Trischler
(74) *Attorney, Agent, or Firm* — Maier & Maier, PLLC

(57) ABSTRACT

A method for checking a battery state for at least one battery of at least one motor vehicle. A. determination of cell voltage differences of particular cell voltage values of at least two battery cells of the at least one battery at different points in time. B. comparison of the cell voltage differences with at least one predetermined cell voltage reference value assigned to the at least two battery cells, and determination of respective deviation values between the cell voltage differences and the at least one cell voltage reference value. C. determination of the battery state of the at least one battery, wherein, based on the particular deviation values, it is determined whether an inadmissible degradation of the battery state is imminent.

9 Claims, 2 Drawing Sheets

Figure 1:
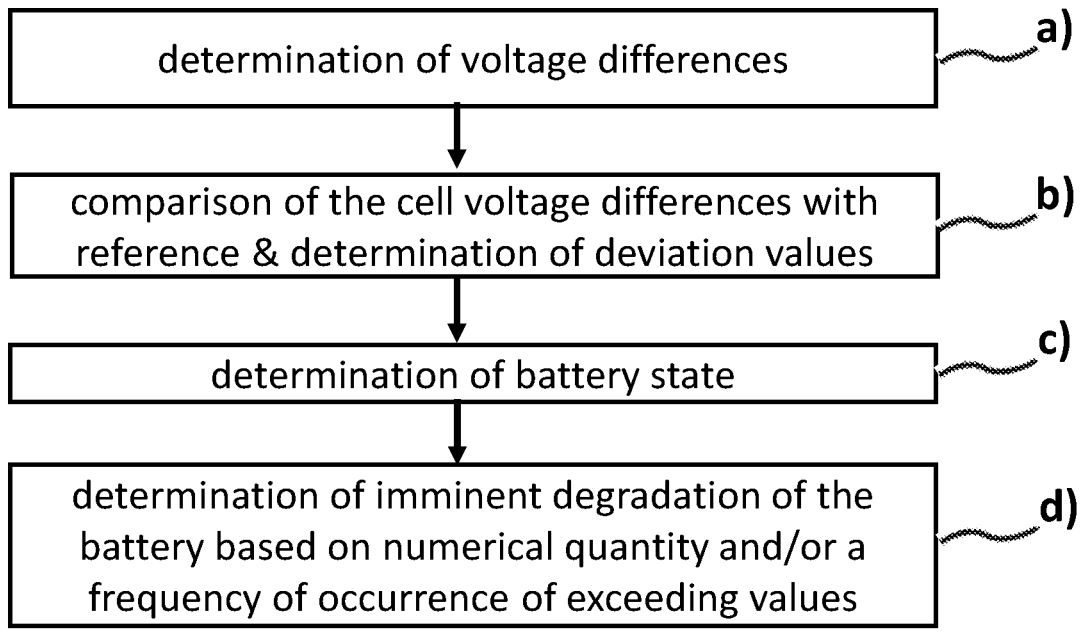

(51) Int. Cl.
*H01M 10/48* (2006.01)
*G01R 31/392* (2019.01)
*G01R 31/396* (2019.01)
*G01R 31/367* (2019.01)
*G01R 31/3835* (2019.01)
*G01R 31/385* (2019.01)

(52) U.S. Cl.
CPC ....... *G01R 31/3835* (2019.01); *G01R 31/392* (2019.01); *G01R 31/396* (2019.01); *H01M 10/486* (2013.01); *G01R 31/386* (2019.01)

(58) Field of Classification Search
USPC .......................................................... 320/104
See application file for complete search history.

(56) References Cited

U.S. PATENT DOCUMENTS

| | | | | |
|---|---|---|---|---|
| 5,079,946 A * | 1/1992 | Motamedi | F02B 77/08 | 73/114.36 |
| 5,170,124 A * | 12/1992 | Blair | H01M 8/04552 | 324/434 |
| 5,525,890 A * | 6/1996 | Iwatsu | G01R 31/3648 | 320/106 |
| 5,644,212 A * | 7/1997 | Takahashi | H01M 10/441 | 320/134 |
| 5,675,258 A * | 10/1997 | Kadouchi | G01R 31/3842 | 324/433 |
| 5,703,469 A * | 12/1997 | Kinoshita | H01M 10/48 | 340/636.19 |
| 5,761,072 A * | 6/1998 | Bardsley, Jr. | G01R 31/367 | 702/63 |
| 5,794,146 A * | 8/1998 | Sevcik | H04W 48/16 | 455/434 |
| 5,945,805 A * | 8/1999 | Takei | G01R 19/16542 | 320/124 |
| 6,091,246 A * | 7/2000 | Saigo | G01R 31/3648 | 324/434 |
| 6,294,894 B1 * | 9/2001 | Ochiai | G01R 31/396 | 320/132 |
| 6,477,024 B1 * | 11/2002 | Kikuchi | G01R 31/3648 | 361/79 |
| 6,490,497 B1 * | 12/2002 | Mitsuhashi | H01L 22/26 | 257/E21.528 |
| 6,512,984 B1 * | 1/2003 | Suzuki | G01R 19/16542 | 702/63 |
| 6,587,799 B2 * | 7/2003 | Suzuki | G01R 19/16542 | 702/63 |
| 7,020,519 B2 * | 3/2006 | Greatbatch | H01M 6/16 | 607/5 |
| 7,079,893 B2 * | 7/2006 | Greatbatch | H01M 10/0525 | 607/5 |
| 7,129,707 B2 * | 10/2006 | Kikuchi | H01M 10/482 | 324/426 |
| 7,176,654 B2 * | 2/2007 | Meyer | H02J 7/0036 | 320/110 |
| 7,211,987 B2 * | 5/2007 | Aoki | H01M 10/486 | 320/134 |
| 7,227,335 B2 * | 6/2007 | Sakakibara | H01M 10/44 | 320/132 |
| 7,245,107 B2 * | 7/2007 | Moore | H02J 7/0069 | 320/112 |
| 7,262,580 B2 * | 8/2007 | Meyer | H02J 7/0091 | 320/110 |
| 7,321,219 B2 * | 1/2008 | Meyer | H02J 7/00036 | 320/125 |
| 7,323,847 B2 * | 1/2008 | Meyer | H02J 7/0031 | 320/110 |
| 7,358,704 B2 * | 4/2008 | Yumoto | G01R 31/389 | 320/132 |
| 7,394,222 B2 * | 7/2008 | Hashimoto | H02J 7/0021 | 320/116 |
| 7,425,816 B2 * | 9/2008 | Meyer | H02J 7/0071 | 320/141 |
| 7,445,861 B2 * | 11/2008 | Murakami | H01M 8/04303 | 429/421 |
| 7,508,167 B2 * | 3/2009 | Meyer | H02J 7/0013 | 320/125 |
| 7,646,176 B2 * | 1/2010 | Yamamoto | H01M 10/48 | 320/150 |
| 8,018,198 B2 * | 9/2011 | Meyer | H02J 7/00036 | 320/125 |
| 8,046,181 B2 * | 10/2011 | Kang | G01R 31/3648 | 702/63 |
| 8,111,037 B2 * | 2/2012 | Zhang | H01M 10/48 | 320/104 |
| 8,163,410 B2 * | 4/2012 | Fulop | H02J 7/00 | 429/61 |
| 8,255,176 B2 * | 8/2012 | Plestid | G01R 31/382 | 702/63 |
| 8,299,759 B2 * | 10/2012 | Okamura | H02J 7/0031 | 320/134 |
| 8,332,169 B2 * | 12/2012 | Kang | G01R 31/392 | 702/63 |
| 8,423,306 B2 * | 4/2013 | Duncan | G01R 31/3648 | 702/63 |
| 8,473,231 B2 * | 6/2013 | Plestid | G01R 31/382 | 702/63 |
| 8,525,479 B2 * | 9/2013 | Meyer | H02J 7/00038 | 320/125 |
| 8,541,122 B2 * | 9/2013 | Fulop | H02J 7/0068 | 429/61 |
| 8,615,372 B2 * | 12/2013 | Tomura | H01M 10/48 | 702/63 |
| 8,635,038 B2 * | 1/2014 | Benjamin | G01R 19/16542 | 702/63 |
| 8,653,793 B2 * | 2/2014 | Ueki | H01M 2/20 | 320/132 |
| 8,738,311 B2 * | 5/2014 | Wu | G01R 31/367 | 702/63 |
| 8,823,325 B2 * | 9/2014 | Ling | G01R 31/3835 | 320/132 |
| 8,860,423 B2 * | 10/2014 | Miyamoto | G01R 31/396 | 324/433 |
| 8,903,674 B2 * | 12/2014 | Hancock | G01R 31/42 | 702/122 |
| 9,054,533 B2 * | 6/2015 | Gaul | H02J 7/00 | |
| 9,103,891 B2 * | 8/2015 | Miyamoto | G01R 31/396 | |
| 9,118,189 B2 * | 8/2015 | Meyer | H02J 7/0071 | |
| 9,134,380 B2 * | 9/2015 | Duncan | G01R 31/3648 | |
| 9,244,132 B2 * | 1/2016 | Bond | G01R 31/392 | |
| 9,397,371 B2 * | 7/2016 | Nishi | H01M 10/48 | |
| 9,601,931 B2 * | 3/2017 | Tabatabaei | H02J 7/0019 | |
| 9,843,069 B2 * | 12/2017 | Marcicki | H01M 10/0525 | |
| 10,008,864 B2 * | 6/2018 | Meyer | H02J 7/0047 | |
| 10,069,314 B2 * | 9/2018 | Dulle | G01R 31/396 | |
| 10,211,490 B2 * | 2/2019 | Okada | H01M 10/48 | |
| 10,218,036 B2 * | 2/2019 | Yoshida | H01M 10/482 | |
| 10,374,443 B2 * | 8/2019 | Meyer | H02J 7/00038 | |
| 10,411,484 B2 * | 9/2019 | Dulle | H01M 10/48 | |
| 10,553,896 B2 * | 2/2020 | Marcicki | H01M 10/0525 | |
| 2001/0009371 A1 * | 7/2001 | Podrazhansky | G01R 31/3835 | 324/432 |
| 2001/0022823 A1 * | 9/2001 | Renaud | H04B 7/2125 | 375/359 |
| 2003/0057918 A1 * | 3/2003 | Aoki | H01M 10/44 | 320/136 |
| 2004/0239333 A1 * | 12/2004 | Kikuchi | H01M 10/482 | 324/434 |
| 2004/0263119 A1 * | 12/2004 | Meyer | H02J 7/0021 | 320/116 |
| 2005/0017685 A1 * | 1/2005 | Rees | G01R 31/392 | 320/132 |
| 2005/0017686 A1 * | 1/2005 | Sakakibara | H01M 10/44 | 320/132 |
| 2005/0017687 A1 * | 1/2005 | Nagaoka | H02J 7/0047 | 320/132 |

(56) References Cited

U.S. PATENT DOCUMENTS

| | | | | |
|---|---|---|---|---|
| 2005/0287880 A1* | 12/2005 | Okuyama | H02J 7/1423 | 440/1 |
| 2006/0071634 A1* | 4/2006 | Meyer | H01M 10/441 | 320/112 |
| 2006/0108975 A1* | 5/2006 | Meyer | H02J 7/00036 | 320/107 |
| 2006/0108983 A1* | 5/2006 | Meyer | H02J 7/0069 | 320/128 |
| 2006/0273761 A1* | 12/2006 | Arai | G01R 31/3842 | 320/132 |
| 2007/0029974 A1* | 2/2007 | Uchida | G01R 31/3842 | 320/132 |
| 2007/0096689 A1* | 5/2007 | Wozniak | G01R 31/3648 | 320/112 |
| 2007/0096743 A1* | 5/2007 | Arai | G01R 31/392 | 324/426 |
| 2007/0103109 A1* | 5/2007 | Meyer | H02J 7/0071 | 320/103 |
| 2007/0120536 A1* | 5/2007 | Runkle | H01M 10/441 | 320/136 |
| 2007/0120537 A1* | 5/2007 | Yamamoto | H01M 10/48 | 320/150 |
| 2007/0182373 A1* | 8/2007 | Sakakibara | H01M 10/44 | 320/115 |
| 2007/0273334 A1* | 11/2007 | Meyer | H02J 7/0014 | 320/138 |
| 2008/0203969 A1* | 8/2008 | Kurihara | H01M 10/0525 | 320/116 |
| 2008/0315834 A1* | 12/2008 | Cruise | H01M 10/30 | 320/113 |
| 2009/0027006 A1* | 1/2009 | Vezzini | H02J 7/0014 | 320/118 |
| 2009/0104510 A1* | 4/2009 | Fulop | H01M 10/0525 | 429/50 |
| 2009/0153101 A1* | 6/2009 | Meyer | H02J 7/0047 | 320/119 |
| 2009/0248230 A1* | 10/2009 | Izumi | H02P 23/0004 | 701/22 |
| 2009/0292487 A1* | 11/2009 | Duncan | G01R 31/3648 | 702/63 |
| 2009/0322340 A1* | 12/2009 | Zhang | H01M 10/48 | 324/433 |
| 2010/0036626 A1* | 2/2010 | Kang | G01R 31/392 | 702/63 |
| 2010/0201323 A1* | 8/2010 | Okamura | H02J 7/0031 | 320/134 |
| 2010/0332166 A1* | 12/2010 | Shin | G01R 31/392 | 702/63 |
| 2011/0127958 A1* | 6/2011 | Ishishita | B60L 58/13 | 320/109 |
| 2011/0161025 A1* | 6/2011 | Tomura | G06F 19/00 | 702/63 |
| 2011/0307202 A1* | 12/2011 | Benjamin | G01R 19/16542 | 702/63 |
| 2012/0001596 A1* | 1/2012 | Meyer | H02J 7/0047 | 320/125 |
| 2012/0035873 A1* | 2/2012 | Kang | G01R 31/3648 | 702/63 |
| 2012/0105097 A1* | 5/2012 | Hancock | G01R 31/42 | 324/764.01 |
| 2012/0143542 A1* | 6/2012 | Wu | G01R 31/367 | 702/63 |
| 2012/0169288 A1* | 7/2012 | Ueki | H01M 2/20 | 320/134 |
| 2012/0187774 A1* | 7/2012 | Tabatabaei | H02J 7/0019 | 307/109 |
| 2012/0187917 A1* | 7/2012 | Sugimura | H01M 10/44 | 320/136 |
| 2012/0262180 A1* | 10/2012 | Ishishita | G01R 31/396 | 324/430 |
| 2012/0263986 A1* | 10/2012 | Fulop | H01M 10/44 | 429/91 |
| 2013/0057293 A1* | 3/2013 | Miyamoto | G01R 31/396 | 324/433 |
| 2013/0066573 A1* | 3/2013 | Bond | G01R 31/392 | 702/63 |
| 2013/0110430 A1* | 5/2013 | Nishi | H01M 10/48 | 702/63 |
| 2013/0162052 A1* | 6/2013 | Gaul | G01R 31/40 | 307/115 |
| 2013/0162217 A1* | 6/2013 | Gaul | H02J 7/00 | 320/134 |
| 2013/0163135 A1* | 6/2013 | Liebhard | H01M 10/441 | 361/86 |
| 2013/0231880 A1* | 9/2013 | Duncan | G01R 31/3648 | 702/63 |
| 2013/0234672 A1* | 9/2013 | Kubota | H02J 7/007 | 320/134 |
| 2013/0314050 A1* | 11/2013 | Matsubara | H02J 7/0077 | 320/134 |
| 2013/0335012 A1* | 12/2013 | Meyer | H02J 7/00036 | 320/107 |
| 2014/0023888 A1* | 1/2014 | Fulop | H01M 2/30 | 429/50 |
| 2014/0176085 A1* | 6/2014 | Maruno | B60L 58/16 | 320/162 |
| 2015/0008930 A1 | 1/2015 | Miyamoto | | |
| 2015/0270725 A1* | 9/2015 | Sorin | H01M 10/48 | 320/136 |
| 2015/0340887 A1* | 11/2015 | Meyer | H02J 7/00036 | 320/112 |
| 2015/0349387 A1* | 12/2015 | Inaba | H02J 7/0019 | 700/297 |
| 2016/0003911 A1* | 1/2016 | Lim | G01R 31/382 | 324/427 |
| 2016/0036096 A1* | 2/2016 | Yoshida | H01M 10/482 | 429/50 |
| 2016/0093927 A1* | 3/2016 | Marcicki | H01M 10/0525 | 429/50 |
| 2016/0169980 A1* | 6/2016 | van Lammeren | G01R 31/396 | 429/90 |
| 2017/0125856 A1* | 5/2017 | Okada | H01M 10/48 | |
| 2017/0126035 A1* | 5/2017 | Tosch | B60L 50/50 | |
| 2017/0207640 A1* | 7/2017 | Wang | H02J 7/0014 | |
| 2018/0034289 A1* | 2/2018 | Meyer | H02J 7/0047 | |
| 2018/0053965 A1* | 2/2018 | Marcicki | H01M 10/482 | |
| 2018/0164384 A1* | 6/2018 | Kwon | G01R 31/392 | |
| 2018/0309304 A1* | 10/2018 | Meyer | H02J 7/0014 | |
| 2019/0310321 A1* | 10/2019 | Mi | H02J 7/0014 | |
| 2019/0356142 A1* | 11/2019 | Meyer | H02J 7/00036 | |

FOREIGN PATENT DOCUMENTS

| | | | | |
|---|---|---|---|---|
| CN | 101813754 A | | 8/2010 | |
| CN | 102119338 A | | 7/2011 | |
| CN | 101930057 B | * | 4/2013 | |
| CN | 104103851 A | | 10/2014 | |
| CN | 104198943 A | | 12/2014 | |
| DE | 112009001552 T5 | | 5/2011 | |
| DE | 102013205334 A1 | | 10/2014 | |
| DE | 102013013471 A1 | | 2/2015 | |
| DE | 102015005132 A1 | | 12/2015 | |
| EP | 1037063 A1 | | 9/2000 | |
| EP | 3018792 A1 | * | 5/2016 | H02J 7/0014 |
| JP | 2002216858 A | * | 8/2002 | G01R 31/3648 |
| JP | 5960017 B2 | * | 8/2016 | H01M 10/44 |
| KR | 20140039110 A | * | 4/2014 | |
| KR | 200479499 Y1 | | 2/2016 | |
| WO | WO-2014154514 A1 | * | 10/2014 | G01R 31/3835 |

* cited by examiner

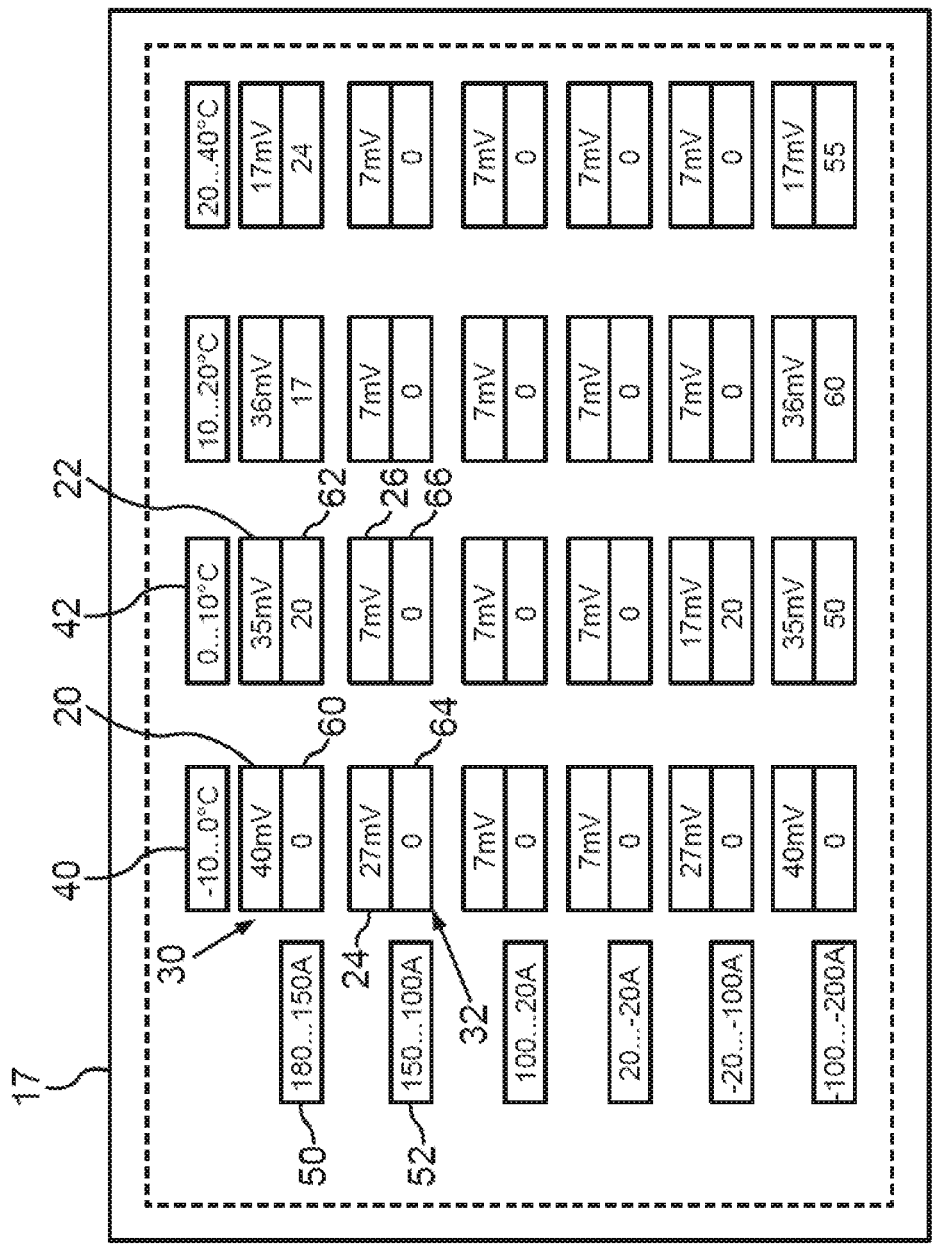

METHOD FOR CHECKING A BATTERY STATE AND AN APPARATUS FOR CHECKING A BATTERY STATE USING VOLTAGE DIFFERENCES

FIELD

The invention relates to a method for checking a battery state for at least one battery of at least one motor vehicle. A second aspect of the invention relates to a checking apparatus for checking a battery state for at least one battery of at least one motor vehicle.

BACKGROUND

Batteries of motor vehicles undergo a large number of charging and discharging operations over the course of their lifetime. Added to this are loads due to temperature fluctuations as well as due to the driving operation of the vehicle. These factors contribute to the fact that various kinds of battery errors or battery defects can arise, which, in the most unfavorable case, can lead to a breakdown of the motor vehicle. Against this background, a breakdown of a high-voltage battery (traction battery) of a purely electrically driven motor vehicle is particularly critical.

Known from DE 10 2015 005 132 A1 is a method for checking a battery, in which a cell voltage of individual cells of the battery is determined and the determined cell voltage is compared automatically with a checking parameter. In this way, batteries replaced in vehicle repair shops can be evaluated in terms of their safety before they are passed on.

EP 1 037 063 A1 describes a detection apparatus for error detection in a battery set, this apparatus comprising a voltmeter and an ammeter. The error detection is made on the basis of the determination of an internal resistance of the battery set.

Known from DE 10 2013 013 471 A1 is a method for determining the lead impedance in multi-cell battery packs for error detection in lines or cables. In this case, the existence of a line error is concluded to be present when respective voltage differences have different signs for different cells within the battery pack.

SUMMARY

The object of the present invention is to create a method as well as a checking apparatus of the kind mentioned in the introduction, which makes possible an especially early detection of a battery error.

This object is achieved by a method having the features of patent claim 1 as well as by a checking apparatus having the features of patent claim 9. Advantageous enhancements of the present invention are the subjects of the dependent claims. Advantageous embodiments of the method according to the invention are also to be regarded here as advantageous embodiments of the checking apparatus, and vice versa.

A first aspect of the invention relates to a method for checking a battery state for at least one battery of at least one motor vehicle, comprising at least the steps:

a) determination of cell voltage differences of respective cell voltage values of at least two battery cells of the at least one battery at different points in time;

b) comparison of the cell voltage differences with at least one predetermined cell voltage reference value assigned to the at least two battery cells and determination of respective deviation values between the cell voltage differences and the at least one cell voltage reference value;

c) determination of the battery state of the at least one battery, wherein, based on the respective deviation values, it is determined whether an inadmissible degradation of the battery state is imminent.

This is of advantage, because, through the determination as to whether an inadmissible degradation of the battery state is imminent, an especially early detection of a battery error is made possible. Through the determination of the cell voltage differences at the different points in time in accordance with step a), the deviation values determined in step b) are also time-dependent, as a result of which the determination of the battery state carried out in step c) on the basis of these deviation values allows a prognosis as to the time course or the magnitude of future deviation values.

The battery can preferably be designed as a high-voltage battery, which may also be referred to as a traction battery. In particular, the battery can be designed as a lithium ion battery (in short: Li Io battery). However, the battery can also be designed as a 12 V starter battery or as a 48 V starter battery, to cite just a few further examples.

The battery can comprise a large number of battery cells that are connected in series. The individual battery cells can differ from one another—owing to fabrication tolerances during the manufacture of the battery cells—in regard to respectively different transition resistances of the respective battery cells, for example. This can give rise to the respectively different cell voltage values, from which the cell voltage differences at different points in time are formed (step a)). Thus, for example, at a first point in time as well as at a second point in time for the at least two battery cells that differ from one another, the respective cell voltage values are determined by direct voltage measurement, for example, and, from said values, the respective cell voltage differences, in turn, are determined. In the simplest case, therefore, based on the cell voltage values of two battery cells at two different points in time, it is possible correspondingly to form two cell voltage differences.

When the method is carried out, the battery can be found in the state in which it is connected in the motor vehicle. The method can therefore be carried out in an advantageous way while the battery is electrically connected to the motor vehicle.

Preferably, the determination of the cell voltage values is made in step a) during an energy exchange between the battery and vehicle components coupled to the battery. Said vehicle components can include consuming units, such as, for example, electric motors, or energy suppliers, such as, for example, generators driven by an internal combustion engine, of the motor vehicle, to cite just a few examples. During the energy exchange, especially marked changes in respective magnitudes of the voltage values may arise and, accordingly, the degradation of the battery state can be detected advantageously on the basis of the deviation values in an especially simple and reliable manner.

The cell voltage reference value can correspond, for example, to a voltage difference of the at least two battery cells when the battery is new. The voltage difference in this new state may also be referred to as a new state voltage difference or as a target voltage difference.

Preferably, it is possible, for example, to make available or to determine a reference characteristic field with a plurality of cell voltage reference values (target voltage differences), wherein the cell voltage reference values can exist under respectively different operating conditions. Different battery temperatures, different states of charge, or different load currents during operation of the battery represent examples of operating conditions of this kind. In accordance therewith, the reference characteristic field can be multidimensional in form. The more operating conditions are provided, the more dimensions the reference characteristic field can have.

In the determination of the battery state of the at least one battery in step c), it is possible, based on the inadmissible degradation of the battery state, to draw a conclusion overall as to a possibly developing defect and, accordingly, a future battery error. In this way, a particular advantage is that the method makes possible a prognosis as to whether a breakdown (battery error) is imminent in the case of the functioning battery. Accordingly, in particular, an imminent breakdown of the battery can be determined reliably in advance as the inadmissible degradation of the battery state. A breakdown of the motor vehicle equipped with the battery can thereby be prevented and an early replacement of the battery can be initiated.

The method makes possible, in particular, an examination of the battery while the battery is being operated in the motor vehicle.

In step c), it is possible, for example, to perform an extrapolation of the respective deviation values. In an advantageous way, it can even be determined thereby in advance, or at least estimated, when, that is, at what future point in time, the inadmissible degradation of the battery state will commence. In this way, it is possible in an advantageous way to recall the motor vehicle especially early on in order to replace the battery, for example.

In an advantageous enhancement of the invention, during comparison of the cell voltage differences with the at least one cell voltage reference value in step b), at least one common operating condition range of the battery and/or of the motor vehicle that is assigned to the cell voltage differences as well as to the cell voltage reference value is taken. This is of advantage, because, in this way, for example, environmental influences or load influences on the battery can at least largely be excluded, as a result of which the comparison of the cell voltage differences with the at least one cell voltage reference value is especially predictive. Environmental influences of this kind are, for example, the ambient temperature (of the battery or of the motor vehicle) and load influences, such as, for example, a load current value, to cite just a few examples. The respective differences of cell voltage and of the at least one cell voltage reference value are classified through the operating condition range, that is, assigned to the same boundary conditions.

In another advantageous enhancement of the invention, the at least one operating condition range comprises a battery temperature interval. This is of advantage, because, through the specification of the battery temperature interval during the comparison of the cell voltage differences with the at least one cell voltage reference value, a common battery temperature range for the cell voltage differences and the at least one cell voltage reference value can be specified in advance. As a result, an especially predictive comparison is possible, especially since temperature influences that falsify the comparison can at least largely be excluded. The battery temperature interval can cover, for example, a range from −10° C. to 0° C. or a range from 10° C. to 20° C., to cite just a few examples.

In another advantageous enhancement of the invention, the at least one operating condition range comprises a charging state interval. This is of advantage, because, by specifying in advance a charging state interval during the comparison of the cell voltage differences with the at least one cell voltage reference value, a common charging state range for the cell voltage differences and the at least one cell voltage reference value can be also be specified in advance. In this way, an especially predictive comparison is possible, especially since charging state influences that falsify the comparison can at least largely be excluded. The charging state interval, which may also be referred to as an SOC interval (SOC=state of charge), can cover, for example, a range from 30% to 40% or a range from 80% to 90% of a maximum charge of the battery, to cite just a few examples.

In another advantageous enhancement of the invention, the at least one operating condition range comprises a load current interval. This is of advantage, because, by specifying a load current interval during the comparison of the cell voltage differences with the at least one cell voltage reference value, a common load current range for the cell voltage differences and the at least one cell voltage reference value can also be specified in advance. In this way, an especially predictive comparison is possible, especially since load influences that falsify the comparison can at least largely be excluded. The load current interval can cover, for example, a range from −20 A to 20 A or a range from 20 A to 100 A, to cite just a few examples.

In another advantageous enhancement of the invention, in step a), a highest voltage value of a first battery cell of the at least two battery cells, on the one hand, and a lowest voltage value of a second battery cell of the at least two battery cells, on the other hand, can be taken as the cell voltage value. This is of advantage, because, in this way, an especially large voltage spread and, accordingly, an especially great difference in the magnitude of the voltage difference can be determined for cell voltage differences, as a result of which, overall, the determination of the battery state can be made particularly precisely.

In accordance therewith, the first battery cell can deliver the largest voltage value of all the battery cells of the battery, whereas the second battery cell can deliver the lowest voltage value of all the battery cells. Through the determination of the cell voltage differences between the highest voltage value and the lowest voltage value (at the different points in time), a change in the cell voltage differences, that is, a change in the cell voltage differences over time, can be detected in an especially secure manner in accordance therewith. A correlation of value pairs of this kind between the highest voltage value and the lowest voltage value is therefore especially predictive in regard to the determination of the battery state.

Preferably, in the scope of the method, the at least two battery cells in regard to the highest voltage value and the lowest voltage value can be specified prior to the determination in step a).

In another advantageous enhancement of the invention, in a further step d), it is determined whether the respective deviation values exceed respective predetermined threshold values, wherein the number of exceeding values is increased when the respective deviation values exceed the respective predetermined threshold values. This is of advantage, because, through the threshold values, a respective tolerance limit can be specified in advance, through which it is possible to prevent, at least largely, any falsification in the determination of the battery state as a consequence of, for example, brief voltage peaks or measurement outliers (measurement errors). The number of exceeding values can be recorded by a so-called "counter." For each respective deviation value that exceeds the respective threshold value at the different points in time, the number of exceeding values (the "counter") is increased by "1." Accordingly, the imminence of the inadmissible degradation of the battery state can be determined especially simply from the frequency of occurrence of the exceeding values.

In another advantageous enhancement of the invention, a degree of severity of the imminent degradation of the battery state is determined as a function of a numerical quantity of the number of exceeding values and/or of a time-dependent number-change gradient for the number of exceeding values. This is of advantage, because, in this way, an especially early response to the imminent, inadmissible degradation of the battery state is made possible. In accordance herewith, it is possible, for example, to initiate a recall of the vehicle once the numerical quantity has attained or exceeded a prespecified limit for the number of exceeding values ("counter limit").

It is especially advantageous when, additionally or alternatively, the degree of severity is determined based on the time-dependent number-change gradient, since, in this way, it is possible to take into consideration how the exceeding values develop over time, that is, the number of exceeding values over time. A strong change in the number-change gradient in this case can point to an especially rapid degradation of the battery state.

In another advantageous enhancement of the invention, the battery state of at least two identically constructed batteries is determined and a conclusion can be drawn as to any problem due to the type of construction of the identically constructed batteries. This is of advantage, because, in this way, it is also possible to detect errors in batteries of the same construction series (battery series). A recall can be initiated thereby, even for vehicles with hitherto normally functioning batteries.

A second aspect of the invention relates to a checking apparatus for checking a battery state for at least one battery of at least one motor vehicle, the apparatus being designed at least for the purpose of comparing the cell voltage differences, which are determined at different points in time, of respective cell voltage values of at least two battery cells of the at least one battery with at least one predetermined reference value of the cell voltage assigned to the at least two battery cells and determining respective deviation values between the cell voltage differences and the at least one cell voltage reference value.

The checking apparatus can be arranged inside the vehicle or in a stationary manner and, accordingly, outside the vehicle. If the checking apparatus is arranged external to the vehicle (for example, at the vehicle manufacturer), then a backend communication with the motor vehicle is possible. The checking apparatus can comprise—in particular when it is arranged in a stationary manner and, accordingly, external to the vehicle—a communication unit, by way of which sensor data of respective vehicle sensors and/or battery sensors can be exchanged. The cell voltage values and, from them, the cell voltage differences can be determined through said vehicle sensors and/or battery sensors.

The checking apparatus can also comprise—when it is arranged inside the vehicle—corresponding sensors, by way of which the cell voltage values can be determined. In this case, it would be possible for the checking apparatus to carry out all steps of the method.

In general, the checking apparatus can comprise a computing unit for carrying out the steps of the method. In step a), the computing unit can actuate the sensors, so that, in accordance therewith, the determination of the cell voltage differences at the different points in time is made by means of the sensor.

The invention also includes enhancements of the checking apparatus according to the invention that have features such as those already described in connection with the enhancements of the method according to the invention. For this reason, the corresponding enhancements of the checking apparatus according to the invention are not described here once again.

BRIEF DESCRIPTION

Figure 2:
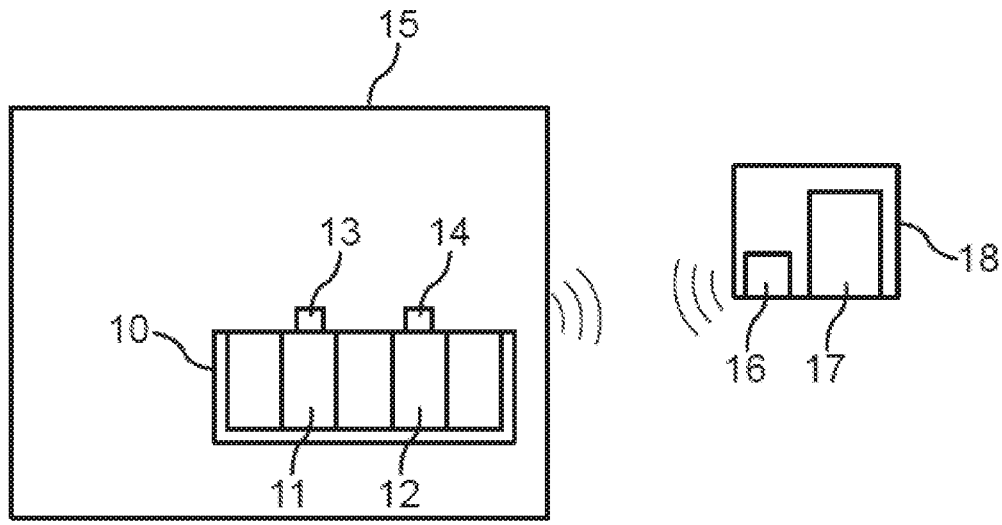

In the following, exemplary embodiments of the invention are described. Shown for this purpose are:

FIG. 1 a flow chart with individual method steps of the method;

FIG. 2 a schematic illustration of a motor vehicle with a battery and a plurality of battery cells, wherein respective cell voltage values are determined at a first battery cell and at a second battery cell by means of respective sensors and are transmitted to an external checking apparatus for evaluation; and FIG. 3 a characteristic field, in which different cell voltage differences are plotted as a function of operating condition ranges, wherein the operating condition ranges each comprise a battery temperature interval as well as a load current interval.

DETAILED DESCRIPTION

In the exemplary embodiments explained in the following, what is involved are preferred embodiments of the invention. In the exemplary embodiments, the described components each respectively represent individual features of the invention that are to be regarded as being independent of one another and each of which the invention further develops also independently of one another and, accordingly, are to regarded, also individually or in a combination different from that shown, as belonging to the invention. Furthermore, the described embodiments can also be supplemented by features of the invention further to those already described.

In the figures, functionally equivalent elements are each furnished with the same reference numbers.

FIG. 1 shows a flow chart with different steps a), b), c), d) of a method for checking a battery state for at least one battery 10 of at least one motor vehicle 15. The battery 10 and the motor vehicle 15 are indicated schematically in FIG. 2.

In step a), a determination of cell voltage differences of particular cell voltage values of at least two battery cells 11, 12 of the at least one battery 10 is made at different points in time. The battery cells 11, 12 as well as the respective sensors 13, 14 are also illustrated schematically in FIG. 2. By means of the first sensor 13, accordingly, a first cell voltage value of the first battery cell 11 is measured and, by means of the sensor 14, a second cell voltage value of the second battery cell 12 is measured.

In step a), as the cell voltage values, a highest voltage value measured at the first battery cell 11 is taken, on the one hand, and a lowest voltage value measured at the second battery cell 12 is taken, on the other hand. In this case, the highest voltage value corresponds to the highest voltage value of all of the battery cells and the lowest voltage value corresponds to the lowest voltage value of all of the battery cells of the battery 10.

In step b), a comparison of the cell voltage differences with at least one predetermined cell voltage reference value assigned to the at least two battery cells 11, 12 is made and a determination of respective deviation values 20, 22, 24, 26 between the cell voltage differences and the at least one cell voltage reference value is carried out. At least some of the deviation values 20, 22, 24, 26 are shown in FIG. 3 by way of example.

In addition, step b) is carried out in a checking apparatus 18 external to the vehicle, wherein the data sets characterizing particular cell voltage values are transmitted from the motor vehicle 15 to a communication unit 16 of the checking apparatus 18 and finally evaluated by means a computing unit 17 of the checking apparatus 18. Besides said data sets—which characterize the cell voltage values—the vehicle 15 can also transmit, in each case, at the different points in time, information on the instantaneous state of charge, the instantaneous battery temperature, and the instantaneous load current to the checking apparatus 18 and, accordingly, an instantaneous (current) operating point of the battery 10 can be characterized precisely, as a result of which a classification of the operating point is made possible. In order to identify the battery 10 unequivocally, it is possible, in addition, to transmit a vehicle identification number (VIN) to the checking apparatus 18.

In the computing unit 1, a reference matrix with a plurality of cell voltage reference values is filed, wherein, in each case, one of the deviation values 20, 22, 24, 26 is compared with a respective cell voltage reference value. Identical operating ranges 30, 32 are assigned in each case to the respective deviation values 20, 22, 24, 26 as well as to the respective cell voltage reference values, with only some of these operating ranges being shown in FIG. 3. In other words, in the comparison of the cell voltage differences 20, 22, 24, 26 with the respective cell voltage reference values in step b), the particular common operating condition ranges 30, 32 of the battery 10 and, additionally or alternatively, of the motor vehicle 15 that are assigned to the cell voltage differences 20, 22, 24, 26 as well as to the cell voltage reference values are taken.

The operating condition ranges 30, 32 each comprise a battery temperature interval 40, 42, a load current interval 50, 52, and a charging state interval. On the basis of the battery data that characterize the instantaneous state of charge, the instantaneous battery temperature, and the instantaneous load current and are transmitted from the motor vehicle 15 to the checking apparatus 18, it is possible to make an assignment of the instantaneous operating point to one of the operating condition ranges 30, 32 and, accordingly, it is possible to make a more precise comparison of the cell voltage difference arising at the operating point (for example, the first cell voltage difference 20) with the corresponding cell voltage reference values (classification). The data exchange between the motor vehicle 15 and the checking apparatus 18, which is located at the manufacturer, for example, can generally occur cyclically.

For reasons of clarity, charging state intervals, which may also be referred to as SOC intervals, are not illustrated here, because an unclear, multidimensional illustration of the characteristic field shown in FIG. 3 would then be necessary.

For the deviation value 20 as well as its associated cell voltage reference value, which, for reasons of clarity, is not illustrated here, the operating condition range 30 applies in the present case. For the deviation value 24 as well as its associated cell voltage reference value, which, for reasons of clarity, is not illustrated here, the operating condition range 32 applies in the present case.

In the present example, the operating condition range 30 comprises the operating temperature interval 40, which, in the present case, extends over a temperature range of −10 to 0° C., as well as the load current interval 50, which, in the present case, extends over a load current range of 180 to 150 A. If the instantaneous battery temperature corresponds, for example, to a value of 7° C. and the instantaneous load current corresponds, for example, to a value of 155 A (at the corresponding point in time), then the deviation value (here: deviation value 20) for the operating condition range 30 thereof is determined.

In contrast, in the present example, the operating condition range 32 comprises the operating temperature interval 40 as well as the load current interval 52, which, in the present case, extends over a load current range of 150 to 100 A.

As can be seen in FIG. 3, additional operating temperature intervals are filed and extend, for example, from 10 to 20° C. or from 20 to 40° C., to cite just a few examples. FIG. 3 also shows that additional load current intervals are filed and extend, for example, from 20 to −20 A or from −100 to −200 A. By providing different signs, it is possible to distinguish between a charging and a discharging of the battery 10.

In step c), a determination of the battery state of the at least one battery 10 is made by means of the checking apparatus 18, wherein, on the basis of the respective deviation values 20, 22, 24, 26, it is determined whether an inadmissible degradation of the battery state is imminent.

In step d), it is determined by means of the checking apparatus 18 whether the respective deviation values 20, 22, 24, 26 exceed respective predetermined threshold values, wherein a number of exceeding values 60, 62, 64, 66 is increased when the particular deviation values 20, 22, 24, 26 exceed the respective predetermined threshold values. In addition, a degree of severity of the imminent degradation of the battery state can be determined as a function of a numerical quantity of the number of exceeding values 60, 62, 64, 66 and, additionally or alternatively, of a time-dependent number-change gradient of the number of exceeding values 60, 62, 64, 66.

FIG. 3 shows a magnitude of 40 mV, by way of example, for the deviation value 20, a magnitude of 35 mV, by way of example, for the deviation value 22, a magnitude of 27 mV, by way of example, for the deviation value 24, and a magnitude of 7 mV, by way of example, for the deviation value 26.

The numerical values of the number of exceeding values shown in FIG. 3 point to an ohmic problem of the battery 10, that is, for example, to the onset of a contacting error at one of the battery cells of the battery 10. This can be seen, for example, in the comparison of the respective quantities of the number of exceeding values 60, 62 that are assigned to the same temperature interval 42 (here: 0-10° C.). The quantity of exceeding values 62 that are assigned to the load current interval 50 (180 to 150 A) corresponds, in the present case, to the value "20." In contrast, the quantity of exceeding values 66 that are assigned to the load current interval 52 (150 to 100 A), which is proportionately smaller in comparison to the load current interval 50, corresponds to the value "0," because, here, no critical threshold value is exceeded and, in accordance therewith, in the load current interval 52, an non-critical, error-free state of the battery 10 exists.

The value "20" for the number of exceeding values 62 points to cell voltage differences that are increasing and, accordingly, becoming ever greater in an inadmissible way at high load, which are characteristic for said ohmic problem.

In summary, the invention is based on the knowledge that many abnormalities and errors that are just beginning for batteries and, in particular, for high-voltage batteries are characterized by an abnormal change in the cell voltage values with respect to one another in the form of a "drifting apart" and, accordingly, a "divergence" of cell voltages under load. The cell voltage differences, which may also be referred to as a spread of cell voltages, are not homogeneous, even in the case of high-performance batteries and are not identical for batteries that are identical in construction (a common battery series) even in their new state. The spread of the cell voltages thus virtually represents a "fingerprint" that is characteristic of the respective battery.

In the scope of the method presented here, the cell voltage differences can be recorded as a function of the state of charge (SOC), of the battery temperature, and of the load current. In particular, it is thereby possible for an online data exchange to occur between the motor vehicle 15 and the checking apparatus 18 or communication unit 16 thereof. By means of the checking apparatus 18, the voltage values that are assigned to the different points in time are stored and compared with the previous values (cell voltage reference values) under the same boundary conditions (operating condition ranges 30, 32 with the corresponding battery temperature intervals 40, 42, charging state intervals, and load current intervals 50, 52, respectively), so that inadmissible deviations over time can be detected, and, by means of the boundary conditions, it is already possible for a first cause assessment to be made before the battery 10 becomes abnormal for a customer, for example. If need be, it is possible subsequently for a preventive repair measure of the battery 10 to be made in the scope of a recall of the motor vehicle 15 and for the battery 10 to be recalled for more detailed analysis.

The invention claimed is:

1. A method for checking a battery state for at least one battery of at least one motor vehicle, comprising:
    a) determination of cell voltage differences of respective cell voltage values of at least two battery cells of the at least one battery;
    b) comparison of the cell voltage differences with at least one predetermined cell voltage reference value assigned to the at least two battery cells, and determination of respective deviation values between the cell voltage differences and the at least one cell voltage reference value;
    c) determination of the battery state of the at least one battery, wherein, based on the respective deviation values, it is determined whether an inadmissible degradation of the battery state is imminent; and
    d) it is determined whether the particular deviation values exceed respective predetermined threshold values, wherein a numerical quantity of exceeding values is increased when the particular deviation values exceed the respective predetermined threshold values, and an occurrence of the exceeding values is recorded by a counter so that an imminent degradation of the battery state is determined based on the numerical quantity of the exceeding values and/or a frequency of the occurrence of the exceeding values,
    wherein a degree of severity of the imminent degradation of the battery state is determined as a time-dependent number-change gradient of the number of exceeding values.

2. The method according to claim 1, wherein, in step a), as the cell voltage values, a highest voltage value of a first battery cell of the at least two battery cells is taken, on the one hand, and a lowest voltage value of a second battery cell of the at least two battery cells is taken, on the other hand.

3. The method according to claim 1, wherein the degree of severity of the imminent degradation of the battery state is further determined as a function of the numerical quantity of the exceeding values.

4. The method according to claim 1, wherein the battery state of at least two identically constructed batteries is determined, and a conclusion is drawn as to a problem caused by the type of design of identically constructed batteries.

5. The method according to claim 1, wherein, in the comparison of the cell voltage differences with the at least one cell voltage reference value in step b), at least one common operating condition range of the battery is used, and the at least one cell voltage reference value is predetermined based on the at least one common operating range.

6. The method according to claim 5, wherein the at least one operating condition range comprises a battery temperature range.

7. The method according to claim 5, wherein the at least one operating condition range comprises a charging state range.

8. The method according to claim 5, wherein the at least one operating condition range comprises a load current range.

9. A vehicle battery checking apparatus comprising: a checking apparatus for checking a battery state for at least one battery of at least one motor vehicle, which is designed at least for the purpose of comparing cell voltage differences of particular cell voltage values of at least two battery cells of the at least one battery, with at least one predetermined cell voltage reference value assigned to the at least two battery cells, and determining particular deviation values between the cell voltage differences and the at least one cell voltage reference value,
    wherein it is determined whether the particular deviation values exceed respective predetermined threshold values, wherein a numerical quantity of exceeding values is increased when the particular deviation values exceed the respective predetermined threshold values, and an occurrence of the exceeding values is recorded by a counter so that an imminent degradation of the battery state is determined based on the numerical quantity of the exceeding values and/or a frequency of the occurrence of the exceeding values, and
    wherein a degree of severity of the imminent degradation of the battery state is determined as a time-dependent number-change gradient of the number of exceeding values.

* * * * *